United States Patent [19]

Marek et al.

[11] Patent Number: 4,670,241

[45] Date of Patent: Jun. 2, 1987

[54] $P_4$ GAS GENERATOR USING THE ALKALI METAL POLYPHOSPHIDE $MP_{15}$

[75] Inventors: Henry S. Marek, South Salem; Christian G. Michel; John A. Baumann, both of Ossining, all of N.Y.; Mark A. Kuck, Upper Montclair, N.J.

[73] Assignee: Stauffer Chemical Company, Westport, Conn.

[21] Appl. No.: 711,451

[22] Filed: Mar. 13, 1985

Related U.S. Application Data

[60] Continuation-in-part of Ser. No. 335,706, Dec. 30, 1981, abandoned, Ser. No. 419,537, Sep. 17, 1982, Pat. No. 4,620,968, Ser. No. 442,208, Nov. 16, 1982, Pat. No. 4,508,931, Ser. No. 509,159, Jun. 29, 1983, Pat. No. 4,596,721, Ser. No. 581,139, Feb. 17, 1984, Ser. No. 509,157, Jun. 29, 1983, abandoned, Ser. No. 509,158, Jun. 29, 1983, Pat. No. 4,591,408, Ser. No. 509,210, Jun. 29, 1983, Pat. No. 4,567,503, Ser. No. 581,115, Feb. 17, 1984, Ser. No. 581,102, Feb. 17, 1984, Ser. No. 581,105, Feb. 17, 1984, Pat. No. 4,618,345, which is a division of Ser. No. 581,101, Feb. 17, 1984, Pat. No. 4,613,485, and Ser. No. 581,104, Feb. 17, 1984, said Ser. No. 442,208, is a continuation-in-part of Ser. No. 335,706, and said Ser. No. 419,537, which is a continuation-in-part of Ser. No. 335,706, said Ser. No. 581,139, is a continuation-in-part of said Ser. No. 509,159.

[51] Int. Cl.[4] ............... C01B 25/01; C01B 25/02; C01B 25/04
[52] U.S. Cl. ................................. 423/322; 423/299
[58] Field of Search ................ 423/322, 323, 299

[56] References Cited

U.S. PATENT DOCUMENTS

| | | | |
|---|---|---|---|
| 2,860,037 | 4/1958 | Kamlet | 423/322 X |
| 3,088,807 | 5/1963 | Williams | 423/322 |
| 3,366,447 | 1/1968 | Suriani | 423/323 |

Primary Examiner—Gregory A. Heller
Attorney, Agent, or Firm—F. Eugene Davis, IV; Mark P. Stone

[57] ABSTRACT

$MP_{15}$, where M is an alkali metal is used in a generator of $P_4$ gas. $KP_{15}$ is preferred. The generator is heated to produce the $P_4$ gas. The generator may be used in various deposition processes such as chemical vapor deposition, vacuum evaporation, and molecular beam deposition. It is particularly useful in high vacuum processes below $10^{-3}$ Torr, particularly below $10^{-4}$ Torr such as vacuum evaporation and molecular beam deposition, for example vapor phase epitaxy and molecular beam epitaxy.

10 Claims, 5 Drawing Figures

P₄ GAS GENERATOR USING THE ALKALI METAL POLYPHOSPHIDE MP₁₅

RELATED APPLICATIONS

This application is a continuation-in-part of the below-identified co-pending U.S. patent applications, Ser. Nos. 335,706, 419,537, 442,208, 509,159, 581,139, 509,157, 509,210, 509,158, 581,115, 581,102, 581,105, 581,101, 581,104.

This application is related to the following co-pending applications, assigned to the same assignee as this application. These applications are incorporated herein by reference. U.S. patent application entitled CATENATED PHOSPHORUS MATERIALS, THEIR PREPARATION AND USES, AND SEMICONDUCTOR AND OTHER DEVICES EMPLOYING THEM, Ser. No. 442,208, filed Nov. 16, 1982, now U.S. Pat. No. 4,508,931 which was a continuation-in-part of our co-pending applications entitled CATENATED SEMICONDUCTOR MATERIALS OF PHOSPHORUS, METHODS AND APPARATUS FOR PREPARING AND DEVICES USING THEM, Ser. No. 335,706, filed Dec. 30, 1981, now abandoned; and MONOCLINIC PHOSPHORUS FORMED FROM VAPOR IN THE PRESENCE OF AN ALKALI METAL, Ser. No. 419,537, filed Sept. 17, 1982, now U.S. Pat. No. 4,620,968 which was a continuation-in-part of Ser. No. 335,706, now abandoned; VACUUM EVAPORATED FILMS OF CATENATED PHOSPHORUS MATERIAL, Ser. No. 509,159, filed June 29, 1983 now U.S. Pat. No. 4,596,721; THERMAL CRACKERS FOR FORMING PNICTIDE FILMS IN HIGH VACUUM PROCESSES, Ser. No. 581,139, filed Feb. 17, 1984, which is a continuation-in-part of Ser. No. 509,159 now U.S. Pat. No. 4,596,721; GRAPHITE INTERCALATED ALKALI METAL VAPOR SOURCES, Ser. No. 509,157, filed June 29, 1983, now abandoned; SPUTTERED SEMICONDUCTOR FILMS OF CATENATED PHOSPHORUS MATERIAL AND DEVICES FORMED THEREFROM, Ser. No. 509,175, filed June 29, 1983, now U.S. Pat. No. 4,509,066; MIS DEVICES EMPLOYING ELEMENTAL PNICTIDE OR POLYPHOSPHIDE INSULATING LAYERS, Ser. No. 509,210, filed June 29, 1983, now U.S. Pat. No. 4,567,503; LIQUID PHASE GROWTH OF CRYSTALLINE POLYPHOSPHIDE, Ser. No. 509,158, filed June 29, 1983; now U.S. Pat. No. 4,591,408 PASSIVATION AND INSULATION OF III-V DEVICES WITH PNICTIDES, PARTICULARLY AMORPHOUS PNICTIDES HAVING A LAYER-LIKE STRUCTURE; Ser. No. 581,115, filed Feb. 17, 1984; THIN FILM FIELD EFFECT TRANSISTORS UTILIZING A POLYPNICTIDE SEMICONDUCTOR, Ser. No. 619,053, filed June 11, 1984, now U.S. Pat. No. 4,558,340; PNCTIDE BARRIERS IN QUANTUM WELL DEVICES, Ser. No. 581,140, filed Feb. 17, 1984, now abandoned; PHOSPHORUS AND HIGH PHOSPHORUS POLYPHOSPHIDE BARRIERS IN QUANTUM WELL DEVICES, Ser. No. 695,268, filed Jan. 28, 1985, which is a Continuation-in-Part of Ser. No. 581,140, now abandoned; USE OF PNICTIDE FILMS FOR WAVE-GUIDING IN OPTO-ELECTRONIC DEVICES, Ser. No. 581,171, filed Feb. 17, 1984, now abandoned; PNICTIDE FILMS FOR WAVE-GUIDING IN OPTO-ELECTRONIC DEVICES, Ser. No. 695,255, filed Jan. 28, 1985, which is a continuation-in-part of Ser. No. 581,171, now abandoned; VACUUM DEPOSITION PROCESSES EMPLOYING A CONTINUOUS PNICTIDE DELIVERY SYSTEM, PARTICULARLY SPUTTERING, Ser. No. 581,103, filed Feb. 17, 1984; CONTINUOUS PNICTIDE SOURCE AND DELIVERY SYSTEM FOR FILM DEPOSITION, PARTICULARLY BY CHEMICAL VAPOR DEPOSITION, Ser. No. 581,102, filed Feb. 17, 1984; METHOD OF PREPARING HIGH PURITY WHITE PHOSPHORUS, Ser. No. 581,105, filed Feb. 17, 1984 now U.S. Pat. No. 4,618,345 PNICTIDE TRAP FOR VACUUM SYSTEMS, Ser. No. 581,101, filed Feb. 17, 1984; now U.S. Pat. No. 4,613,485 and HIGH VACUUM DEPOSITION PROCESSES EMPLOYING A CONTINUOUS PNICTIDE DELIVERY SYSTEM, Ser. No. 581,104, filed Feb. 17, 1984.

TECHNICAL FIELD

This invention relates to a P₄ gas generator using the alkali metal polyphosphide MP₁₅. More particularly, it relates to the use of MP₁₅, where M is an alkali metal, as a source of P₄ gas in various deposition processes such as chemical vapor deposition, and particularly in high vacuum processes such as vacuum evaporation, and molecular beam deposition, including vapor phase and molecular beam epitaxy.

BACKGROUND ART

The use of solid red phosphorus as a controlled source of P₄ gas in various deposition processes presents severe problems due to (a) the multiphasic nature of commercial red phosphorus; (b) the resultant variability of equilibrium vapor pressure and other thermodynamic properties; (c) thermal instability of red phosphorus (e.g. multiple phase transitions); and, (d) the slow kinetics of vaporization of red phosphorus.

For example, in the temperature range of 300°–400° C., the time required for red phosphorus to reach its equilibrium vapor pressure is about 20 hours. Thus, for the first 20 hours of any deposition at a constant temperature the gas produced from a phosphorus generator will be changing. This makes it very difficult to produce P₄ gas from red phosphorus at a constant rate. For optimum control of the process, One either has to try to vary the temperature in some way during the initial heating of the phosphorus in an attempt to produce P₄ at a constant rate or one must wait the 20 hours for the phosphorus to reach its equilibrium vapor pressure, before doing any deposition.

Vacuum evaporation processes are disclosed in the above-identified co-pending applications entitled VACUUM EVAPORATED FILMS OF CATENATED PHOSPHORUS MATERIAL, THERMAL CRACKERS FOR FORMING PNICTIDE FILMS IN HIGH VACUUM PROCESSES, and HIGH VACUUM DEPOSITION PROCESSES EMPLOYING A CONTINUOUS PNICTIDE DELIVERY SYSTEM. The latter two applications also disclose molecular beam deposition (molecular beam epitaxy) apparatus. These earlier applications either use a heated generator containing red phosphorus or utilize a carrier gas passing through heated white phosphorus to produce the P₄ gas when required.

As disclosed in the prior above-identified application entitled SPUTTERED SEMICONDUCTING FILMS OF CATENATED PHOSPHORUS MATE- RIALS AND DEVICES FORMED THEREFORM, it has been found that using pure $KP_{15}$ as a sputtering target produces potassium-rich depositions due to the high volitility of phosphorus.

DISCLOSURE OF THE INVENTION

We have studied the thermodynamic properties of $KP_{15}$ prepared by different processes. Our data shows $KP_{15}$ to be a well behaved monophasic material, which smoothly decomposes upon heating in a vacuum to $P_4$ gas and $K_3P_7$. Red phosphorus is a polymorphic material comprised of many phases. Measured thermodymanic properties depend strongly upon the method of preparation and history of each sample. Crystalline red phosphorus is perhaps the most well defined phase of red phosphorus allotropes. We have compared the thermodynamics of $KP_{15}$ dissociation and vaporization of crystalline red phosphorus. The standard enthalpy and entropy values were calculated from the Equilibrium Vapor Pressure Versus Temperature data. Our data show that the presence of a K-P bridge within the one-dimensional structure of parallel P pentagonal tubes is correlated with the greater thermal stability of the polyphosphide compounds compared to the crystalline modification of red phosphorus.

Suprisingly we found the rate of dissociation of $KP_{15}$ crystalline materials to be significantly faster than the vaporization of crystalline red P. That is, the time to establish vapor pressure equilibrium upon a change in temperature from the solid phase is significantly longer for crystalline phosphorus than for crystalline $KP_{15}$. From the difficulty in obtaining single phase crystalline red phosphorus the variable nature of the other red phosphorus allotropes and the significantly faster kinetics of dissociation of $KP_{15}$, we conclude that a heated generator containing $KP_{15}$ is a better source of $P_4$ gas in deposition processes than one containing red phosphorus. These processes include chemical vapor deposition, vacuum evaporation, and molecular beam deposition.

We have also found that crystals of $KP_{15}$ produced in a liquid phase growth process are more crystalline than those produced by other processes and are therefore preferred for $P_4$ gas generators. Our thermally heated $P_4$ generators using $KP_{15}$ are particularly useful in high vacuum processes where the pressure is below $10^{-3}$ Torr and preferably below $10^{-4}$ Torr. Particular temperature ranges for these processes are disclosed below.

OBJECTS OF THE INVENTION

It is therefore an object of the invention to provide a $P_4$ gas generator.

Another object of the invention is to provide a $P_4$ gas generator which performs better than the red phosphorus generators of the prior art.

A further object of the invention is to provide a $P_4$ gas generator for various deposition processes.

A still further object of the invention is to provide a $P_4$ as generator for chemical vapor deposition, vacuum evaporation, and molecular beam deposition.

Still another object of the invention is to provide a $P_4$ gas generator particularly for such high vacuum deposition apparatus such as vacuum deposition and molecular beam deposition.

Other objects of the invention will in part be obvious and will in part appear elsewhere in this application.

The invention accordingly comprises several steps and the relation of one or more of such steps with respect to each of the others, the apparatus embodying the features of construction and arrangement of parts which are adapted to effect such steps, and the articles possessing the features, properties and relation of elements which are exemplified in this application. The scope of the invention is indicated in the claims.

BRIEF DESCRIPTION OF THE DRAWINGS

For a fuller understanding of the nature and objects of the invention reference should be made to the following detailed description taken in conjunction with the accompanying drawings in which.

The same reference numbers refer to the same elements throughout the several views of the drawings.

BEST MODE FOR CARRYING OUT THE INVENTION

Figure 1:
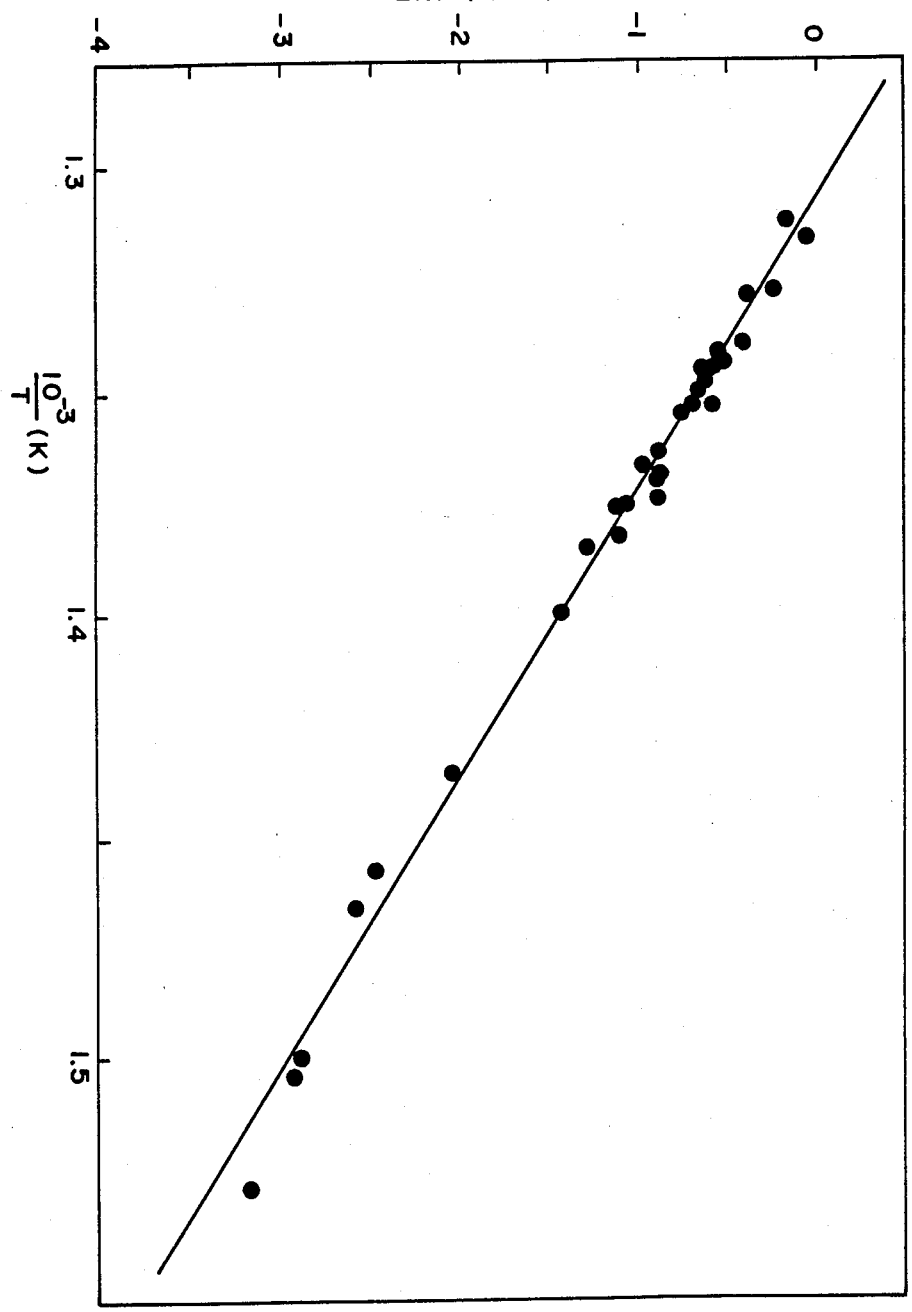
FIG. 1 is a plot of vapor pressure of $P_4$ as a function of temperature for $KP_{15}$.

We measured the equilibrium vapor pressure of phosphorus over crystalline $KP_{15}$ in the temperature range of 305° to 530° C. by means of a Bourdon gauge. The reaction of $6/19\ KP_{15}(s) = 2/19\ K_3P_7(s) + P_4(g)$ is described by the equation $$\ln p\ (\text{atm}) = -\frac{14849 \pm 340}{T} + 19.35 \pm 0.5$$

The calculated standard enthalpy and entropy of this reaction are $$\Delta H°_{298} = 118.8 \pm 2.9\ \text{kJ/mol}$$

$$\Delta S°_{298} = 159.0 \pm 4.2\ \text{J/mol K}$$

The standard enthalpy for the formation of $KP_{15}$ from the elemental gases

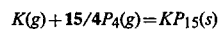

$$K(g) + 15/4 P_4(g) = KP_{15}(s)$$

was found to be $\Delta H°_{v,298} = -651.0 \pm 3.3$ kJ/mol.

Our data show that the thermal stability of $KP_{15}$ is greater than that of crystalline red phosphorus. In addition, the kinetics of dissociation of $KP_{15}$ were found to be significantly faster than the kinetics of vaporization of crystalline red phosphorus.

The useful semiconductor properties of polyphosphide materials have been disclosed in the above-identified co-pending applications. These materials were prepared in our laboratory by several processes. However, until now, very little has been known about their thermodynamic properties.

Metal polyphosphides having the formula $MP_{15}$ (M=alkali metal) constitute a family of P-rich materials with structural units which are derivatives of Hittorf's phosphorus. These polyphosphides have a unique atomic framework: a one dimensional polymer-like structure consisting of parallel phosphorus tubes of pentagonal cross-section linked by M-P bridges.

The crystalline metal polyphosphides (MP$_{15}$) and Hittorf's (monoclinic) phosphorus both contain layers of P tubes. However, in Hittorf's phosphorus two consecutive layers of P tubes are linked with each other crosswise while all the layers are aligned parallel to each other in the metal polyphosphides.

The vapor pressure of various modifications of solid red phosphorus has been previously studied as a function of temperature. See K. J. Bachmann, E. Buehler, J. Electrochem. Soc., N 6, 121, 835 (1974). Here, we report the equilibrium vapor pressure of phosphorus over crystalline KP$_{15}$. Standard enthalpies for the dissociation reaction and for the formation of KP$_{15}$ from the elemental gases were calculated from our pressure-temperature data and compared with the thermodynamics of red phosphorus.

The tensimetric apparatus used in this work consisted of a quartz Bourdon gauge of the spoon-type used as a null-point instrument and controllers to monitor pressure-temperature. Gauges of various sensitivity were obtained by varying the size and thickness of the spoon. A 25 —cm. quartz rod pointer was attached to the top of the spoon. Deflection of the rod caused by the vapor pressure in the reaction chamber was detected by observing the displacement of the pointer image from a fixed reference using an optical system. The displacement caused by the vapor pressure on the sample side of the Bourdon gauge was countered by applying argon gas pressure. The argon pressure was measured with a mercury manometer having an accuracy of 1 Torr over a range from 3 to 800 Torr.

Before each experiment the empty gauge chamber was baked at approximately 550° C. with continuous pumping at approximately $10^{-5}$ Torr for several hours. The apparatus was tested by reproducing the vapor pressure data of the Bachmann et al article for commercially available red phosphorus.

The sample of KP$_{15}$ (approximately 0.1 g to 0.5 g) was introduced into the reaction chamber at room temperature under nitrogen. The sample was degassed by pumping for several hours at 150° C. and then sealed.

During the experiments, the temperature was varied in steps of approximately 20° C. and maintained constant at sufficiently high temperatures to prevent any condensation of phosphorus.

SAMPLE PREPARATION

The crystalline KP$_{15}$ materials used in this study were prepared by three different methods. Raman and X-ray powder diffraction spectra were used as fingerprints to identify these materials. Slight differences were observed in the line broadening of the X-ray diffraction peaks suggesting a variation in the degree of crystallinity of the KP$_{15}$ materials according to the method of preparation. The DTA curve of the crystalline KP$_{15}$ used in the study consists of a single sharp endotherm, at 640° C. Repeated heatings of the same sample resulted in virtually identical DTA curves. Samples of commercially available red phosphorus exhibited a sharp endotherm in the 590°–600° C. region. The different processes used for the synthesis of KP$_{15}$ crystalline materials are described below.

1. Condensed Phase (CP)

Polycrystalline KP$_{15}$ materials were synthesized by the direct solid state reaction of potassium and red phosphorus as disclosed in the above-identified application Ser. No. 442,208. The initial stoichiometric mixture consists of high purity potassium (4N) and electronic grade red phosphorus (6N) ball-milled under a nitrogen atmosphere for 48 hours at 70°–80° C. The resulting mixture was transferred under nitrogen to a Pyrex reaction tube. The tube was heated at 450° C. for 100 hours. Based on the absence of a peak at 590°–600° C. in the DTA data, these materials did not contain red P. The DTA results indicated a solid state conversion from the elements into KP$_{15}$. However, the broadening of the X-ray powder diffraction peaks was found to be significant for this KP$_{15}$ material. These data suggest that polycrystalline KP$_{15}$ prepared by the CP process have small crystallite size with a low degree of crystallinity.

2. Vapor Transport (VT)

In this process, the KP$_{15}$ samples were synthesized by vapor transport in a sealed quartz ampoule by heating the metal and red phosphorus as disclosed in the above-identified application Ser. No. 442,208. Modifications were made in our system in order to optimize the yield and to improve the control in the deposition zone of the KP$_{15}$ whiskers.

Large quantities of dark-red, long (greater than 1 ) cm) KP$_{15}$ whiskers were obtained by monitoring the heating cycle of the K and P charge and by controlling the temperature (approximately 450° C.) in the reaction zone over a large area.

3. Liquid Phase (LP)

KP$_{15}$ crystalline materials were prepared in quasiequilibrium conditions from the liquid phase (LP) in a sealed tube system as disclosed in the above-identified application Ser. No. 509,158. In the LP process, large KP$_{15}$ crystals (1.5 cm×0.5 cm×0.01 cm) were grown by slow cooling (1° C./minute) from 660° C. to 630° C. in a specially designed LP apparatus. The volume-to-charge ratio was calculated to maintain the melt composition of KP$_{15-x}$ within the limit x less than 2 during the growth cycle. The LP growth was terminated at approximately 630° C. by using a tilting furnace. Unlike CP and VT materials, these LP samples exhibited sharp X-ray diffraction peaks and second-order Raman scattering. These features are characteristic of high-quality crystals and suggest that of the three processes, KP$_{15}$ materials prepared by liquid phase have the highest degree of crystallinity.

RESULTS

Mass spectral analyses performed on KP$_{15}$ whiskers indicated that P$_4$ was the only significant vapor species present between 280°–450° C. In this temperature interval, the ion current increased rapidly with a change to a higher isotherm and then slowly tapered off. The observed P$_4$ evolution suggests that the kinetics of the process is diffusion controlled. In the tensimetric experiment, the composition of the solid phase can be calculated provided that the composition and the mass of the initial phase and the volume of the reaction chamber are known. The P:K ratio of the final solid product was 2.3:1. From the calculated composition of the final solid product in the tensimetric experiment and considering the mass spectral results, the reaction equation can be formulated as follows:

$$6KP_{15}(s) = 2K_3P_7(s) + 19P_4(g) \qquad [1]$$

This equation is in agreement with the observations of R. P. Santandrea, H. G. von Schnering 8 ETPC, Abstracts, p. 279, 27/9-1/10, 1982, obtained with their Knudsen effusion technique.

FIG. 1 gives the measured vapor pressure as a function of temperature of KP$_{15}$ decomposition obtained from 33 independent data points. In spite of the fairly high temperatures, about 24 hours were usually required for equilibrium to be established at each temperature step. Approximately 95% of equilibrium was established within approximately 2 hours, usually less than 1 hour. Data were taken only when the measured pressure did not change more than 2 mm in 10 hours. The time to obtain this equilibrium was faster by about one order of magnitude of KP$_{15}$ then for red phosphorus.

Figure 2:
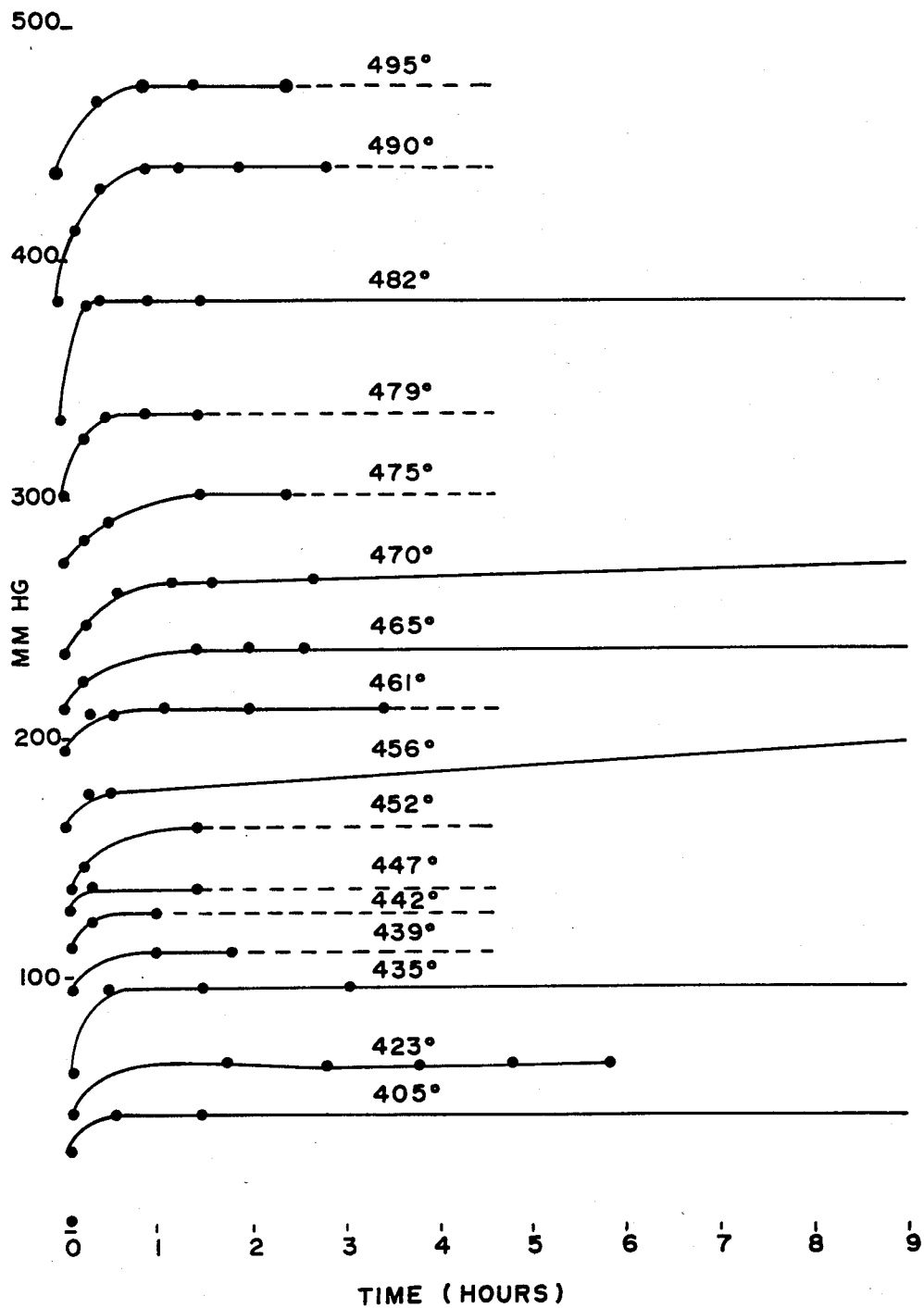
FIG. 2 is a plot of vapor pressure of $P_4$ as a function of time at several fixed temperatures of $KP_{15}$.

FIG. 2 shows this quick approach to equilibrium pressure for a number of runs. By contrast, in the temperature range of 300°–400° C. the time required for red phosphorus to reach its equilibrium vapor pressure is about 20 hours.

All vapor pressure measurements were taken in the KP$_{15}$+K$_3$P$_7$ two-phase region as indicated by the constant pressure at any one isotherm throughout the experiment.

The tensimetric data were obtained during heating. When the system was cooled, the rate of the reverse reaction decreased rapidly and equilibrium was not established even after 100 hours.

The pressure data obtained from the KP$_{15}$ crystalline materials prepared from condensed phase, vapor transport and liquid phase were found to be slightly different. A trend was observed which suggests an inverse correlation between vapor pressure and degree of crystallinity. Therefore, LP materials with the highest degree of crystallinity were used to establish the P-T dependence at low pressure in the plot shown in FIG. 1.

For the reaction:

$$6/19 KP_{15}(s) = 2/19 K_3P_7(s) + P_4(g) \quad [2]$$

the following equation was obtained from a least square fit of the experimental data:

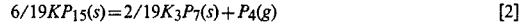

$$\ln p \text{ (atm)} = -\frac{14849 \pm 340}{T} + 19.35 \pm 0.5$$

Using elemental heat capacities from the literature, standard enthalpy and entropy of the reaction [2] were calculated $$\Delta H°_{298} = 118.8 \pm 2.9 \text{ kJ/mol}$$

$$\Delta S°_{298} = 159.0 \pm 4.2 \text{ J/mol K}$$

Since the reaction took place in the two-phase region, KP$_{15}$+K$_3$P$_7$, pressures of P$_4$ at any isotherm were constant. Thus, the enthalphy of formation of KP$_{15}$ can be calculated by a method analogous to that used by R. Schiffman for binary compounds.

In this calculation, the activity of K is estimated using the Gibbs-Duhem equation, and it is assumed that the range of homogeneity of KP$_{15}$ is small. For the following reaction:

$$K(g) + 15/4 P_4(g) = KP_{15}(s) \quad [4]$$

the enthalpy of formation from the elemental gases calculated by the third law method is:

$$\Delta H°_{v,298} = 651.0 \pm 3.3 \text{ kJ/mol}.$$

DISCUSSION OF EXPERIMENTAL RESULTS

Vaporization of both KP$_{15}$ and crystalline red P yields P$_4$ vapor. The structural units of these two compounds consist of the same infinite P tubes with pentagonal cross-section. Thus, it can be expected that the decomposition and vaporization of these compounds would have approximately the same enthalpy and entropy of the reactions.

In the temperature range investigated from (305° C. to 530° C.) we have found for the reaction [2]

$$\Delta H_T = 123.4 \pm 2.1 \text{ kJ/mol}$$

and $$\Delta S_T = 160.7 \pm 4.2 \text{ J/mol}$$

The values of thermodynamic functions are comparable with those reported for the crystalline modification of red P in about the same temperature range $$\Delta H_T = 133.5 \text{ kJ/mol}$$

$$\Delta S_T = 186.2 \text{ J/mol}$$

Recent studies also showed a similarity in the temperature dependence of the heat capacity between KP$_{15}$ and crystalline red P. These data demonstrate that the same basic structural units of covalently bonded P tubes dominate the thermodynamic properties of the metal polyphosphides and crystalline red P.

Figure 3:
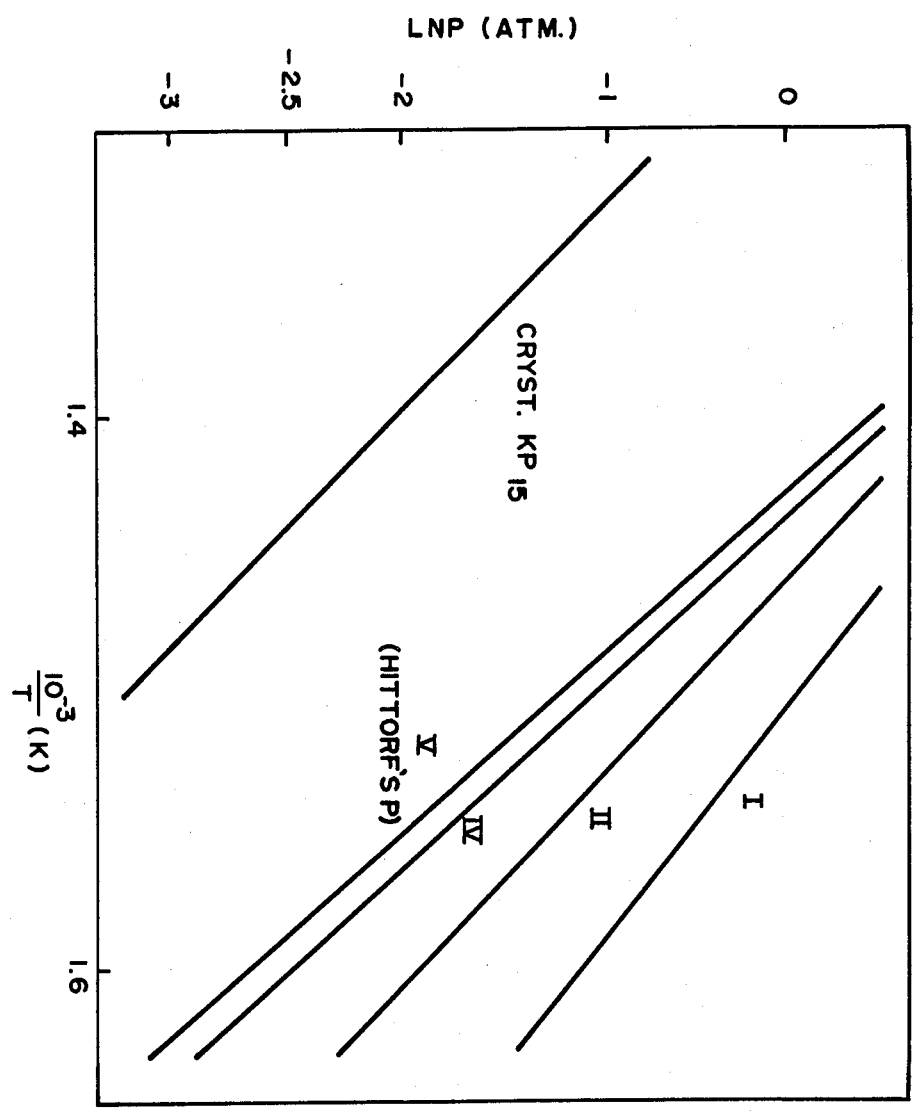
FIG. 3 is a comparative plot of vapor pressure of $P_4$ versus temperature for $KP_{15}$ and various crystalline modifications of red phosphorus.

FIG. 3 is a comparative plot of the temperature dependence of the vapor pressure for crystalline KP$_{15}$ and the various crystalline modifications of red P referred to as forms I, II, IV and Hittorf's P. An increase in the degree of crystallinity from form I to form IV is inferred from the methods of preparation of these materials and their corresponding X-ray powder diffraction patterns.

The Gibbs functions for the various modifications of red P calculated for the average temperature of our experiment (T=683 K.) are:

$$\Delta G_T(I) = -2385 \text{ J/mol}$$

$$\Delta G_T(II) = 397 \text{ J/mol}$$

$$\Delta G_T(IV) = 2582 \text{ J/mol}$$

$$\Delta G_T(V)^* = 3335 \text{ J/mol}$$

$$\Delta G_T(KP_{15}) = 13690 \text{ J/mol}$$

* Hittorf's P

These data indicate that a gradual increase in the degree of crystallinity of the various modifications of red P is directly correlated with lower vapor pressure at any given temperature and, accordingly, an increase in thermal stability as shown in FIG. 3.

The calculated values of the Gibbs function indicate that the presence of a K-P bridge within the one-dimensional structure of KP$_{15}$ increases its thermal stability as compared with crystalline P. In addition, analysis of our tensimetric data shows that the kinetics of dissociation of KP$_{15}$ is much faster than the kinetics of vaporization of red P. Hence, at low pressure, KP$_{15}$ appears to be more suitable source of P$_4$ than red P, especially in processes where the control of P$_4$ gas evolution is required.

Enthalpy of formation is calculated from data for the elemental gases instead of from the solid elements. This is because subtracting the elemental gas-solid enthalpy results in the difference between two large numbers which is smaller than the standard deviation of the components and is greatly dependent upon the source used for the elemental enthalpies. However, if R. Hultgren, P. P. Desai, D. T. Hawkins, M. Gleiser, K. K. Kelley, A. D. Wagman, "Selected Values of the Thermodynamic Properties of the Elements", American Society for Metals, Metal Park, OH, 1973, is used for the enthalpy of potassium, the reaction:

$$K_{(s)} + 15/4 P_{4(g)} = KP_{15(s)},$$

$$H^\circ_{298} = -35.10 \, kJ/mol$$

can be compared with the enthalpy of vaporization of red phosphorus of $$H^\circ_{298} = -32.13 \, kJ/mol.$$

Enthalpy of formation for $KP_{15}$ from the elemental gases was also calculated by the second law method with the 33 data points giving:

$$H_{v,298} = -657.7 \pm 21.3 \, kJ/mol$$

The standard deviation here is within the value of our third law calculations of $-651.0 \pm 3.3$ kJ/mol. The larger deviation in the second law result is to be expected within the restricted temperature range of this investigation. The third law value was preferred since it is less sensitive to temperature errors.

Thus, the use of solid red phosphorus as a source for Molecular Beam Epitaxy (MBE) and other forms of molecular beam deposition, or Vapor Phase Epitaxy (VPE) and other forms of vacuum deposition, presents severe process problems mainly due to the slow kinetics of vaporization.

For example, in the temperature range of 300°–400° C. the time required for red P to reach its equilibrium vapor pressure is about 20 hours (measured from our tensimetric experiments).

Tensimetric data, taken in the same temperature range of 300° C.–400° C. indicate that the vapor pressure of $KP_{15}$ reaches equilibrium in about 2 hours.

Hence, the kinetics of dissociation of $KP_{15}$ is much faster than the kinetics of vaporization of red phosphorus by about one order of magnitude.

Therefore, $KP_{15}$ appears to be a more suitable source of $P_4$ than red P in processes where control of $P_4$ gas pressure and volume is required such as MBE with a Knudsen cell and VPE using an open solid source and other vacuum evaporation and molecular beam deposition processes.

Based on our thermal stability study of $KP_{15}$ by the tensimetric method, the temperature range for the use of $KP_{15}$ for MBE applications is between 300° C.–400° C., inclusive; and for VPE application is between 350° C.–550° C., inclusive. The amount of $P_4$ gas evolving during the dissociation can be calculated from the known function of Pressure versus Temperature and the initial mass of the sample. The dissociation of $KP_{15}$ is accompanied with a change in the P/K ratio from 15 to 2.3 (2.3 corresponds to $K_3P_7$ solid phase).

VACUUM EVAPORATION

Figure 4:
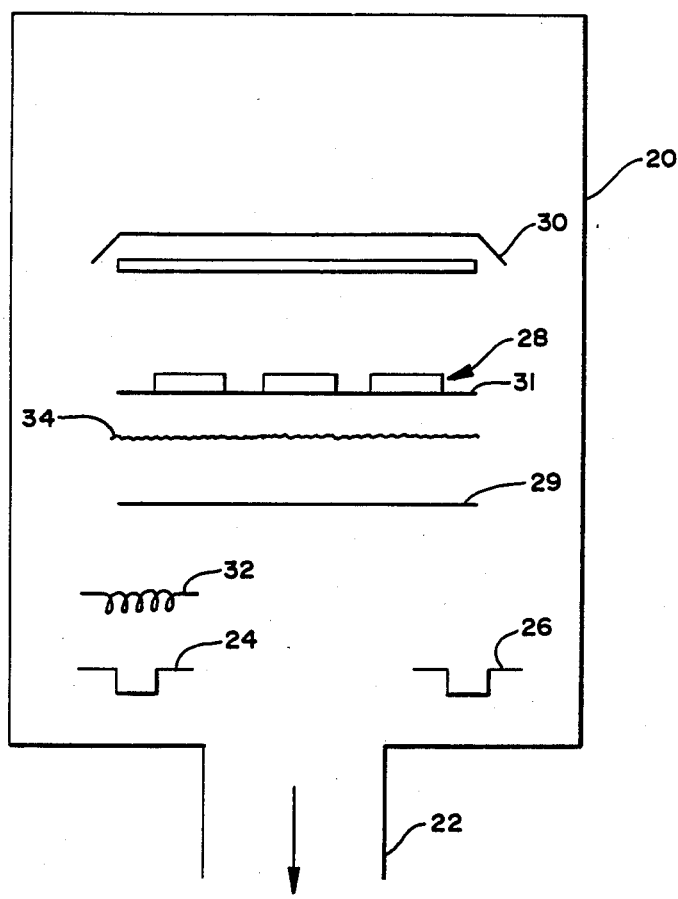
FIG. 4 is a schematic diagram of vacuum evaporation apparatus according to the invention.

Referring to FIG. 4, a Cooke high vacuum evaporator 20, Model CVE 301, may be diffusion pumped through outlet 22 to a base pressure of less than $1 \times 10^{-6}$ torr. Two baffle boat sources of co-evaporation obtained from R. D. Mathis are used, one 24 containing $KP_{15}$ crystals, preferably produced by liquid phase growth. The other boat 26 contains granular $KC_8$, a graphite intercalation compound. The sources are independently, resistively heated by conduction and the temperature monitored by thermocouples (not shown). The substrates 28 are approximately 6" above the sources and shielded by a movable shutter 29. A quartz radiant heater 30 is used to bring the substrate temperature to 275°–285° C. The substrates may be for example glass, metallized glass (metallized with Ni and Ti) and GaP, GaAs, InP.

Two high temperature tungsten "crackers" are used to convert the evaporating $P_4$ species to $P_2$. One is a coiled filament 32 directly above the exit of the P source; the other is a straight wire 34 1" below the substrates. Both wires are resistively heated to above 1000° C.

The $KP_{15}$ source 24 is heated to between 350° C. and 550° C. until a constant pressure of $8-9 \times 10^{-4}$ torr is reached, as measured by a vacuum ionization gauge in the chamber 20. The $KC_8$ source 26 is heated to 275°–295° C. When both the $KC_8$ temperature and chamber pressure are stabilized, the shutter 29 is moved to allow deposition of the film. A deposition under these conditions will deposit an amorphous film of $KP_{15}$.

MOLECULAR BEAM EPITAXY

Figure 5:
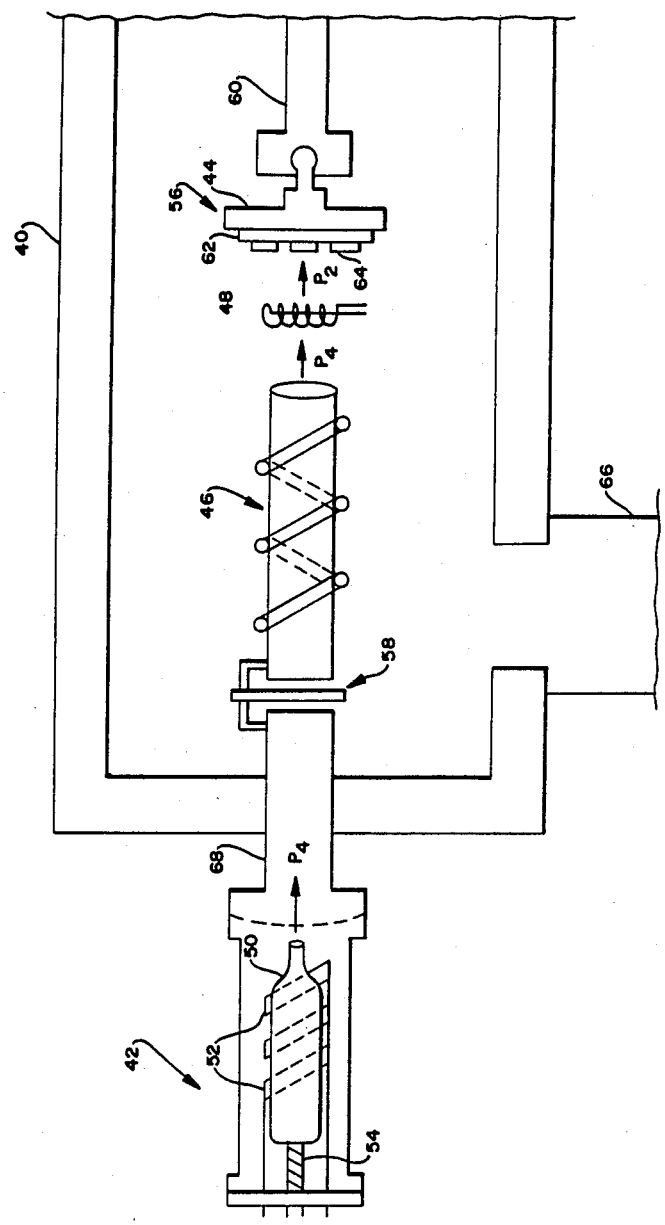
FIG. 5 is a partial schematic diagram of molecular beam deposition apparatus according to the invention.

Molecular beam apparatus which may employ the invention is shown schematically in FIG. 5. The system illustrated is a Vactronics, Inc. molecular beam epitaxy system Model 6000S. It comprises a vacuum chamber 40, a molecular beam furnace, generally indicated at 42, a target support 44, a molecular beam water-cooled baffle or collimator 46, and an electrically heated filament 48 which acts as the thermal cracker.

A Knudsen cell 50, is electrically heated by conduction by a resistance heater 52. The Knudsen cell is contacted by a thermocouple 54 so that the temperature may be controlled. For depositing phosphorus the Knudsen cell 50 contains $KP_{15}$ and the phosphorus exits the Knudsen cell as shown by the arrow as $P_4$ species. Those molecules which are not directed at the target, generally indicated at 56, condense on the wall of the water-cooled baffle, generally indicated at 46. The beam may be turned on and off by means of a shutter, generally indicated at 58. The $P_4$ species exiting the collimator 46 is cracked by the heated filament 48 to $P_2$ species which proceeds to the target 56.

The target comprises target holder 44 and support 60. The target may comprise, for example, a glass substrate 62 with III-V crystals 64 mounted thereon. The entire apparatus is drawn to high vacuum through the exit port 66.

While we have disclosed the use of $KP_{15}$ in our apparatuses and methods it is contemplated that other alkali metal polyphosphides having the formula $MP_{15}$, where M is an alkali metal, or combinations thereof, may be used as sources of $P_4$ gas.

According to our process, the $MP_{15}$ is thermally heated as by the conduction thermal heater of the apparatus of FIG. 4 and the conduction thermal heater 52 of FIG. 5. A radiant thermal heater may also be used. By thermal we mean to distinguish bombardment by much hotter particles such as in sputtering. That is, the source of the energy applied in our process is not at a substantially greater temperature that that at which is desired to maintain the $MP_{15}$ phosphorus vapor generator.

It will thus be seen that the objects set forth above, among those made apparent from the preceding description, are efficiently obtained and, since certain changes may be made in carrying out the above methods and in the apparatus and articles set forth without departing from the scope of the invention, it is intended that all matter contained in the above description or shown in the accompanying drawing, shall be interpreted as illustrative and not in a limiting sense.

It is also to be understood that the following claims are intended to cover all of the generic and specific features of the invention herein described, and all statements of the scope of the inventin which, as a matter of language, might be said to fall therebetween.

Particularly, it is to be understood that in the claims, ingredients and compounds recited in the singular are intended to include compatible mixtures of such ingredients wherever the sense permits.

Having described our invention what we claim as new and desire to secure by Letters Patent is:

1. A method of producing $P_4$ gas as a controlled source for use in a vacuum deposition process including the steps of heating $MP_{15}$, where M is a alkali metal, to a temperature between 300° C–550° C. at a pressure less than $10^{-3}$ Torr, to produce $P_4$ gas having a substantially constant vapor pressure, and supplying said $P_4$ gas as a controlled vapor source in a vacuum deposition process.

2. The process of claim 1 wherein said alkali metal is potassium.

3. The process of claim 1 wherein said $MP_{15}$ is produced by a liquid phase growth process.

4. The process of claim 1 wherein said vacuum is greater than $10^{-4}$ Torr.

5. The process of claim 1, 2, or 3 wherein said process is a molecular beam deposition process.

6. The process of claim 5 wherein said heating step is carried out at a temperature within the range of 300° C. to 400° C., inclusive.

7. The process of claim 1 wherein said heating step is carried out at a temperature within the range of 350° C. to 550° C., inclusive.

8. The process of claim 1, 2, or 3 wherein said heating step is accomplished by thermally heating said $MP_{15}$.

9. The process of claim 1 wherein said $MP_{15}$ is produced by a condensed phase process.

10. A process of using $MP_{15}$ as a controlled source of $P_4$ gas comprising the step of heating $MP_{15}$ where M is an alkali metal, to a temperature between 300° C.–550° C. at a pressure less than $10^{-3}$ Torr, to release $P_4$ gas having a substantially constant vapor pressure to provide a controlled source of said released $P_4$ gas.

* * * * *